uses

United States Patent
Ishizaki

[11] Patent Number: 5,920,236
[45] Date of Patent: Jul. 6, 1999

[54] OSCILLATOR CIRCUIT HAVING A POWER CONTROL ELEMENT TO INITIATE OSCILLATION IN A SHORTENED TIME PERIOD

[75] Inventor: Yasuhiro Ishizaki, Tokyo, Japan

[73] Assignee: Mitsubishi Denki Kabushiki Kaisha, Tokyo, Japan

[21] Appl. No.: 08/914,779

[22] Filed: Aug. 20, 1997

[30] Foreign Application Priority Data

Apr. 23, 1997 [JP] Japan ................................. 9-105758

[51] Int. Cl.⁶ ........................................ H03B 5/36
[52] U.S. Cl. ................ 331/185; 331/115; 331/117 R; 331/158; 455/86
[58] Field of Search ............................. 331/117 R, 158, 331/116 FE, 185, 186, 115; 455/256, 257, 258, 259, 86

[56] References Cited

U.S. PATENT DOCUMENTS 4,282,496  8/1981  Heuner ........................ 331/116 FE

FOREIGN PATENT DOCUMENTS

A 62-53030   3/1987   Japan.
A 7-283655  10/1995   Japan.
A-8-79123    3/1996   Japan.

*Primary Examiner*—Arnold Kinkead

[57] ABSTRACT

An oscillator usable for a TDMA type wireless mobile communication device in which an average current at the communication terminal is decreased. The oscillator has a switching circuit or a timing circuit which controls an operating current of an amplifying element 8 for oscillation and reduces an average current in a TDMA operation without changing a voltage applied to a passive element constituting the oscillator. In particular, before initiating oscillation, elements in a negative impedance circuit are charged with a current of a value which does not cause the oscillation of the oscillator, and at the time of initiating the oscillation, a current capable of oscillating the oscillator is supplied to the negative impedance circuit.

16 Claims, 12 Drawing Sheets

FIGURE 3
(a)
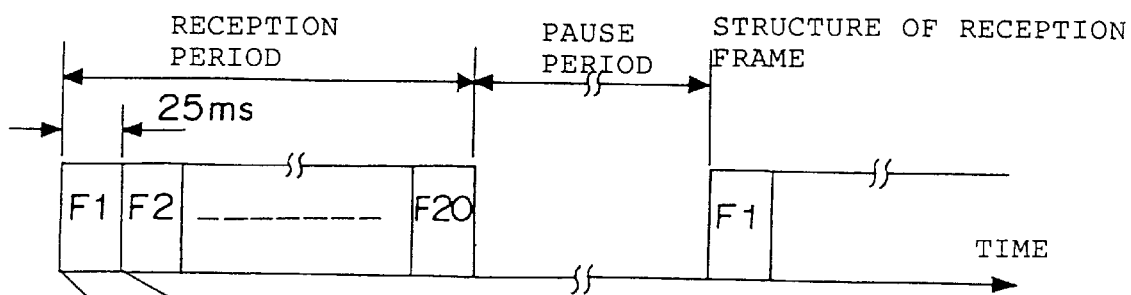
(b)
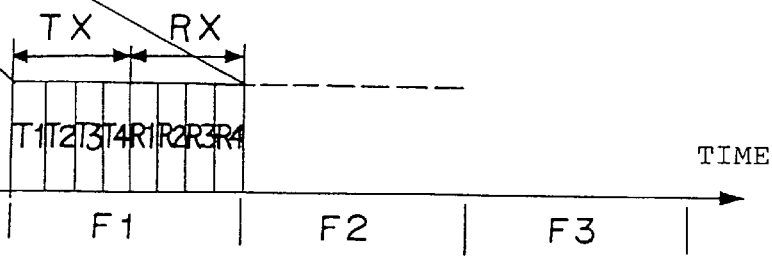
(c)
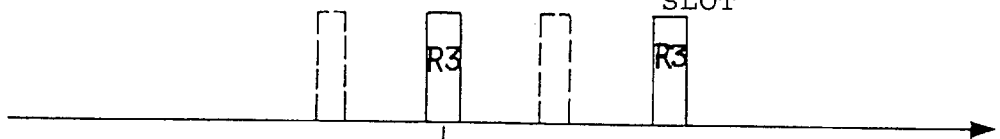
(d)
PREPARATORY PERIOD — ON PERIOD OF SW 11
(e)
PREPARATORY PERIOD — ON PERIOD OF SW 17

FIGURE 5
(a)
(b)
(c)
(d)

FIGURE 7
(a) 
INTERMITTENT RECEPTION SLOT
(b) 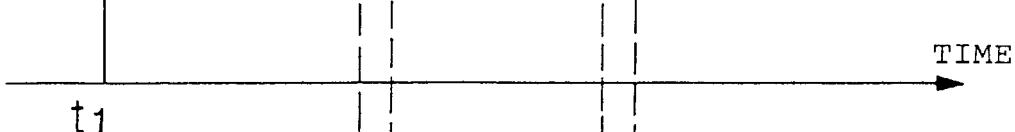
PREPARATORY PERIOD
ON PERIOD OF SW 11
t1
(c) 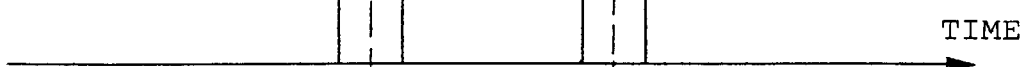
ON PERIOD OF SW 17
(d) 
ON PERIOD OF SW 22

FIGURE 13
(a)
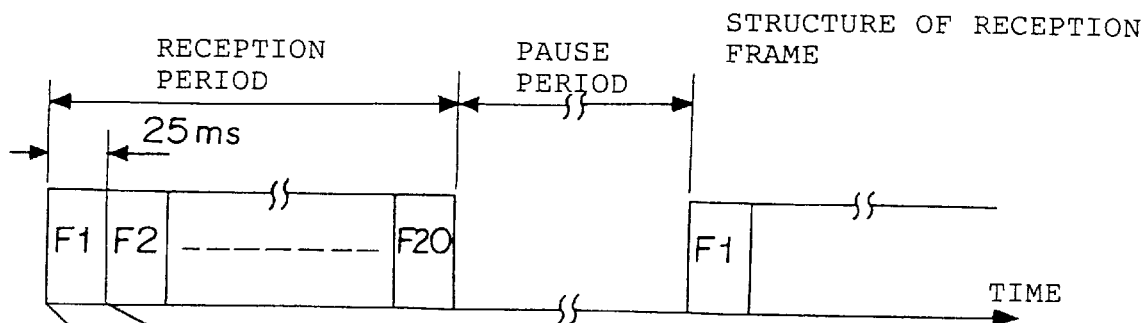
STRUCTURE OF RECEPTION FRAME
(b)
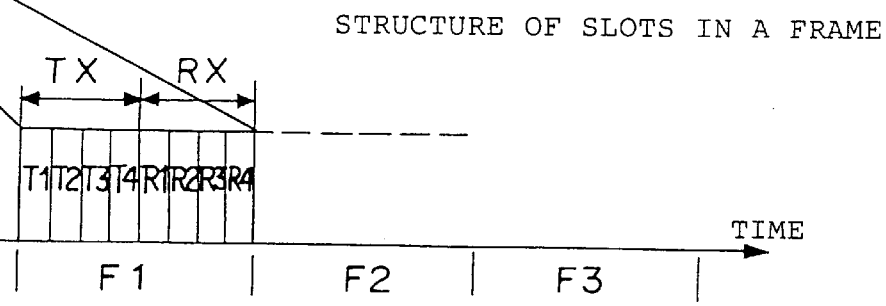
STRUCTURE OF SLOTS IN A FRAME
(c)
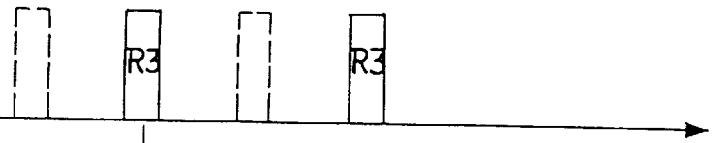
INTERMITTENT RECEPTION SLOT
(d)
ON PERIOD OF SW 11

FIGURE 14
(a)
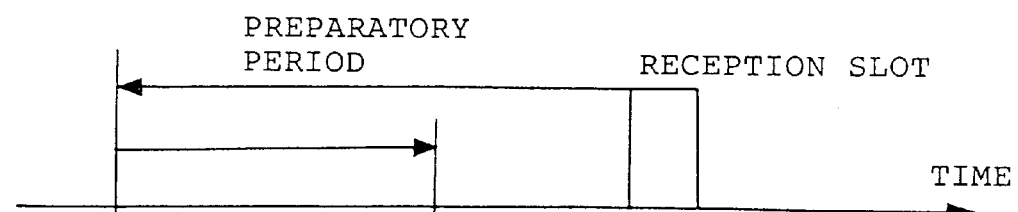
(b)
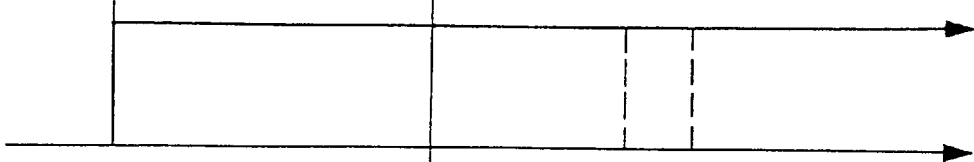
(c)
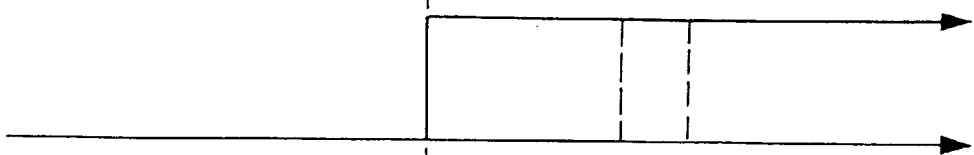
(d)
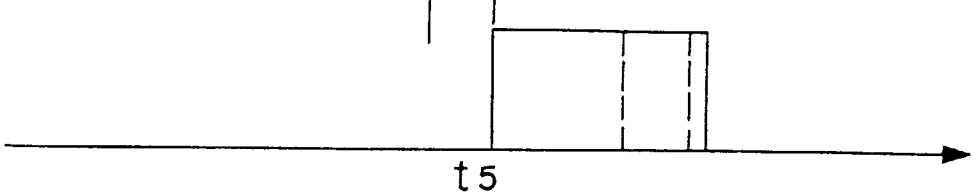
(e)
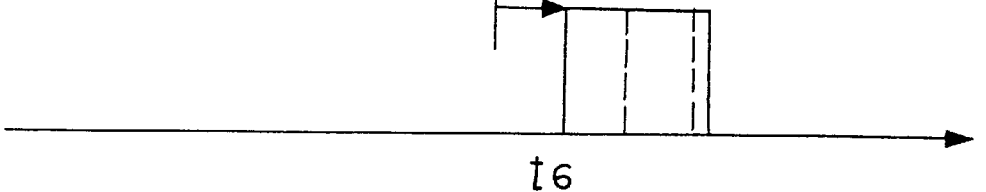

5,920,236

OSCILLATOR CIRCUIT HAVING A POWER CONTROL ELEMENT TO INITIATE OSCILLATION IN A SHORTENED TIME PERIOD

BACKGROUND OF THE INVENTION

FIELD OF THE INVENTION

The present invention relates to an oscillator used for, a example, a mobile communication device.

DISCUSSION OF BACKGROUND

FIG. 12 shows a circuit diagram of a conventional crystal oscillator wherein reference numeral 1 designates a crystal vibrator, numeral 2 designates a coupling capacitor, numerals 3 and 4 designate resistors for producing a bias voltage, numeral 5 designates a base-emitter capacitor, numeral 6 designates an emitter-GND capacitor, numeral 7 designates an emitter resistor, numeral 8 designates a transistor, numeral 9 designates an inductor as a load at a collector side of the transistor 8, numeral 10 designates a connecting capacitor, numeral 11 designates a switch (SW) for connecting a power source, and numeral 12 designates a power source.

Operations of the conventional crystal oscillator will be described.

When the switch 11 is closed to connect the power source 12, a voltage divided by the resistors 3, 4 is produced to be applied to the base of the transistor 8. Then, an emitter current Ie which can be indicated by the following formula passes into the transistor 8, and the transistor 8 starts an amplifying operation:

$$Ie=(Eb-Vbe)/Re$$

where Eb represents an applied voltage, Vbe represents a base-to-emitter voltage of transistor, and Re represents the resistance of the emitter resistor 7.

The crystal vibrator 1 and a feedback element such as the capacitors 5, 6 are connected to the base of the transistor 8. Accordingly, when the switch 11 is closed, the base voltage does not rise immediately because of the feed back capacitors 5, 6 being charged. Namely, there is a delay in rising of the base voltage until the capacitors are sufficiently charged. Accordingly, an emitter current does not immediately increase, hence, the mutual conductance Gm as an amplification constant of the transistor 8 does not increase. Accordingly, the negative conductance is small because of small amplification, and oscillation can not be started.

Generally, a negative resistance Rn can be expressed as follows:

$$Rn=-Gm(Ie)/\omega 2C5C6$$

where Gm represents the mutual conductance of the transistor 8 and C5 and C6 represent the capacitances of the capacitors 5, 6.

When a loss in the crystal vibrator is expressed by R, it is necessary to establish R<|Rn| for starting oscillation. As is understood from this, a large value of Gm is required.

Further, since the impedance 1/ωC6 of the capacitor 6 should sufficiently be smaller than the emitter resistance Re, there is a limitation to increase excessively a value of 1/ω2C5C6. On the other hand, when the impedance 1/ωC6 is too small, it will take a time for charging/discharging.

An application where the oscillation circuit shown in FIG. 12 is installed in a mobile communication terminal which employs a TDMA (time division multiplex accessing) system, will be described.

FIG. 13 is a timing chart of receiving signals intermittently in the TDMA system. FIG. 13a shows a structure of a reception frame in which a reception period and a pause period appear repeatedly. The reception frame comprises a plurality of frames F1, F2 . . . F20 each having 2.5 ms. FIG. 13b shows a structure of slots in each frame in which a frame comprises transmission slots and reception slots. Each of the transmission slots has four slots T1, T2, T3 and T4, and each of the reception slots have four slots R1, R2, R3 and R4. FIG. 13c shows a timing of receiving signals in a mobile communication terminal to which a reception slot R3 is assigned. FIG. 13d shows a control timing for the switch 11 in the oscillation circuit in FIG. 12.

As mentioned above, in the conventional crystal oscillator shown in FIG. 12, a charging/discharging time to the crystal vibrator and the capacitors as a feed-back element to produce a negative resistance, is long. Accordingly, when signals are intermittently received, it is necessary for obtaining a stable standard frequency of oscillation to close the switch 11 sufficiently earlier than the reception slot R3, as shown in FIG. 13d, and to start the operations of the circuit for receiving signals. Namely, it is necessary to make the switch 11 with a predetermined period as a preparatory period to take into account charging/discharging time to the crystal vibrator and the capacitors.

The conventional oscillation circuit requiring such control consumes an excessive amount of circuit current during the preparatory period. Sometimes, is required during which takes a long preparatory period wherein the circuit current is consumed continuously over the entire intermittent reception periods F1 through F20. When the circuit current is consumed continuously during intermittent signal reception periods in a case of a 4-slot TDMA-TDD system, an average current of the circuit for receiving signals is 8 times as much as an average current in a case of operating only the period of reception slots, whereby a value of electric current consumed in the oscillator is more than negligible.

In the above, description has been made as to the crystal oscillator producing a standard oscillation frequency. However, the same description can be applied to a frequency synthesizer.

FIG. 1 is a block diagram of a wireless mobile communication terminal of TDMA-TDD system wherein reference numeral 101 designates an antenna, numeral 102 designates a switch, numeral 103 designates a signal reception section, numeral 104 designates a signal transmission section and numeral 105 designates a synthesizer for changing frequency for the signal reception section 103. The synthesizer 105 includes a voltage controlling oscillator VCO and a phase lock loop (PLL) circuit. Numeral 106 designates a synthesizer for generating a signal transmitting frequency and numeral 107 designates a crystal oscillator for generating a standard frequency. Numeral 108 designates a control section which produces modulation/demodulation signals for receiving and transmitting signals; determines a frequency for the synthesizers; connects or disconnects the power source to elements in the circuit and conducts a slot control. Numeral 109 designates a power source, and numerals 201 through 204 designate switches for controlling the power source.

FIG. 14 is a diagram for illustrating a timing for connecting the power source in the wireless mobile communication terminal of TDMA-TDD system shown in FIG. 1. As shown in FIG. 14, operation of the crystal oscillator 107, the synthesizer for receiving signals 105 and the signal reception section 103 are started in that order.

In a state of communication, each reception slot is received in a time from t3 to t4 as shown in FIG. 5a. At the time t1 which is earlier by a preparatory period than the time at which the reception slot is received, a power source voltage is applied to the crystal oscillator 107 (FIG. 5b). At the time t2 which is after the time t1, the voltage controlling oscillator in the synthesizer 105 is started (FIG. 5c). Thus, the power source voltage is applied to the crystal oscillator 107 and the voltage controlling oscillator which have a longer charging/discharging time, before receiving the reception slot.

Generally, the crystal oscillator 107 and the voltage controlling oscillator are continuously operated during a communication period. In the continuous operation during the communication, an average current flowing in the circuit is 8 times as much as the case of operating the signal reception section 103 and the control section 108 only in reception slots, whereby the average current in the synthesizer becomes so large that it is not negligible.

In such a conventional oscillator, the oscillation circuit must be continuously operated since a longer time for charging/discharging is required. Accordingly, a sufficiently small average voltage cannot be obtained even in the wireless mobile communication terminal of TDMA system wherein signal transmitting/receiving operations are effected under time division.

In the above, description has been made as to the reception slot. However, the same problem takes place with respect to the transmission slot.

Japanese Unexamined Patent Publication JP-A-8-79123 discloses a conventional technique wherein a bias voltage is applied to an amplifying element, and a power source is made ON/OFF. Accordingly, the amplifying element can quickly be operated. However, there is no contribution to charging/discharging to LCR in the circuit. Further, Japanese Unexamined Patent Publication JP-A-7-283655 describes that a power source voltage is always applied to an amplifying element, and a bias power source is made ON/OFF. Accordingly, although the operation of the amplifying element can be quick, there is no contribution to charging/discharging to LCR in the circuit. Although some effect can be expected in an amplifying circuit, there is no effect in an oscillation circuit.

Japanese Unexamined Patent Publication JP-A-62-53030 discloses that a voltage detecting circuit is disposed for waiting to detect installment to a cradle, in order to prevent a battery consumption of a subsidiary machine.

As described above, in the conventional oscillator with an element or elements having a longer charging/discharging time, it is necessary to set a preparatory period in order to effect oscillation, and to operate in consideration of the preparatory period. Accordingly, the conventional oscillator has the problem that an average electric current consumed by the oscillator is increased.

SUMMARY OF THE INVENTION

It is an object of the present invention to provide an oscillator capable of consuming a decressed average electric current level.

In accordance with a first aspect of the present invention, there is provided an oscillator which comprises a negative impedance circuit including an amplifying element and a feedback element; a resonator connected to the negative impedance circuit; a power source connected to the negative impedance circuit, and a power source control means connected to the power source, wherein the power source control means is so adapted that before initiating oscillation, the elements in the negative impedance circuit are charged with an electric current of a value which does not cause the oscillation of the oscillator, and when oscillation is initiated, a sufficient amount of electric current is supplied to the amplifying element of the negative impedance circuit to thereby cause the oscillation of the oscillator without changing a voltage applied to each of the elements.

In a second aspect of the present invention, there is provided an oscillator which comprises a negative impedance circuit including an amplifying element and a feedback element; a resonator connected to the negative impedance circuit; a power source connected to the negative impedance circuit, and a power source control means connected to the power source, wherein the power source control means is so adapted that before initiating oscillation, the resonator is charged with an electric current of a value which does not cause the oscillation of the oscillator, and at the time of initiating the oscillation, a sufficient amount of electric current is supplied to the amplifying element of the negative impedance circuit to thereby cause the oscillation of the oscillator without changing a voltage applied to the resonator.

In a third aspect of the invention, there is provided an oscillator which comprises a negative impedance circuit including an amplifying element and a feedback element; a resonator connected to the negative impedance circuit; a power source connected to the negative impedance circuit, and a power source control means connected to the power source, wherein the power source control means is so adapted that before initiating oscillation, the resonator and the feedback element are charged with an electric current of a value which does not cause the oscillation of the oscillator, and at the time of initiating the oscillation, a sufficient amount of electric current is supplied to the amplifying element to thereby cause the oscillation of the oscillator without changing a voltage applied to the resonator and the feedback elements.

In a fourth aspect of the invention, there is provided an oscillator which comprises a negative impedance circuit including a first amplifying element, a second amplifying element in a cascode connection to the first amplifying element and a feedback element; a resonator connected to the negative impedance circuit; a power source connected to the negative impedance circuit; and a power source control means connected to the power source, wherein the power source control means is so adapted that before initiating oscillation, the first amplifying element, the resonator and the feedback element are charged with an electric current of a value which does not cause the oscillation of the oscillator, and at the time of initiating the oscillation, a sufficient amount of current is supplied through the first amplifying element to the second amplifying element to thereby cause the oscillation of the oscillator.

In a fifth aspect of the invention, there is provided an oscillator according to any one of the first through the fourth aspect of the invention, wherein the power source control means comprises a current limiting means which initiates the oscillation of the oscillator by supplying an electric current having a higher current value than a current capable of initiating the oscillation of the oscillator, and which, after the initiation of the oscillation, limits the current to a value capable of maintaining the oscillation of the oscillator.

In a sixth aspect of the invention, there is provided an oscillator according to any one of the first through the fifth aspect of the invention, wherein the power source control means controls the oscillation by changing an operating current to the amplifying element.

In a seventh aspect of the invention, there is provided an oscillator according to the sixth aspect, wherein the power source control means changes stepwisely the operating current by using it as a current for a constant current source.

In an eighth aspect of the invention, there is provided an oscillator according to the seventh aspect, wherein the power source control means changes stepwisely the operating current by switching a plurality of switches.

In a ninth aspect of the invention, there is provided an oscillator according to the seventh aspect, wherein the power source control means changes stepwisely the operating current by changing a terminal voltage at resistances which determine the operating current to the amplifying element.

In a tenth aspect of the invention, there is provided a communication device comprising a communication means for effecting time division multiplex accessing for a plurality of time slots and an oscillator supplying a signal of predetermined frequency to the communication means, wherein the oscillator comprises a negative impedance circuit including an amplifying element and a feedback element; a resonator connected to the negative impedance circuit; a power source connected to the negative impedance circuit, and a power source control means connected to the power source, wherein the power source control means is so adapted that before initiating oscillation, the elements in the negative impedance circuit are charged with an electric current of a value which does not cause the oscillation of the oscillator, and at the time of initiating the oscillation, a sufficient amount of electric current is supplied to the amplifying element of the negative impedance circuit to thereby cause the oscillation of the oscillator without changing a voltage applied to each of the elements.

BRIEF DESCRIPTION OF DRAWINGS

A more complete appreciation of the invention and many of the attendant advantages thereof will be readily obtained as the same becomes better understood by reference to the following detailed description when considered in connection with the accompanying drawings, wherein:

FIG. 3(a), 3(b), 3(c), 3(d), and 3(e) are timing charts showing how to control the oscillator according to the first embodiment of the present invention;

FIG. 5(a), 5(b), 5(c), and 5(d), are timing charts showing how to control the oscillator according to the second embodiment of the invention;

FIG. 7(a), 7(b), 7(c), and 7(d), are timing charts showing how to control the oscillator according to the third embodiment of the invention;

FIG. 13(a), 13(b), 13(c), and 13(d), are timing charts showing how to control the conventional oscillator; and FIG. 14(a), 14(b), 14(c), 14(d), and 14(e) are timing charts showing how to control the conventional oscillator.

PREFERRED EMBODIMENTS OF THE INVENTION

Figure 1:
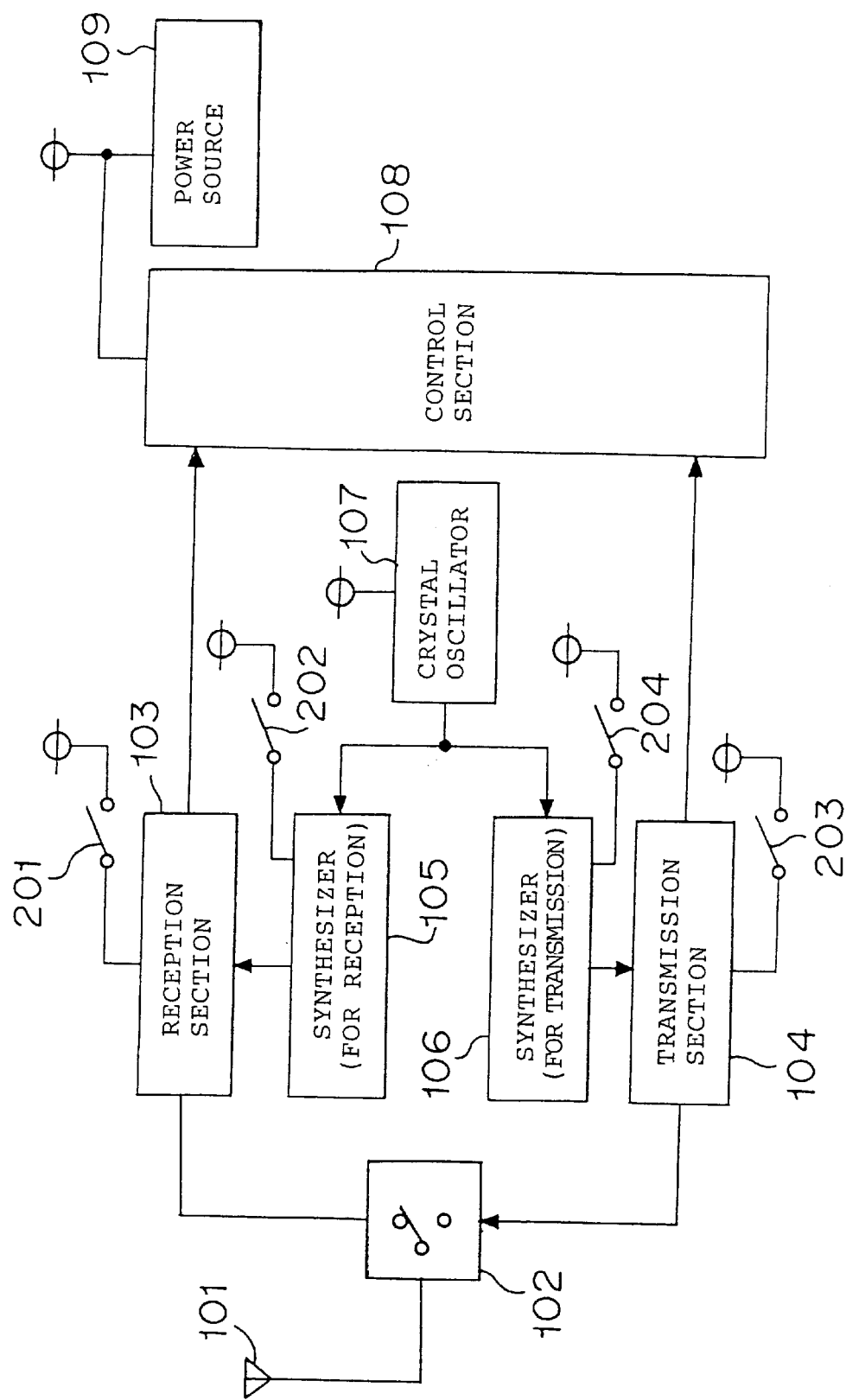
FIG. 1 is a block diagram showing a wireless mobile communication terminal of TDMA-TDD system.

Preferred embodiments of the present invention will be described with reference to the drawings wherein the same reference numerals designate the same or corresponding parts.

FIG. 1 is a block diagram showing a wireless mobile communication device of a TDMA-TDD system to which the oscillator in accordance with the first embodiment of the present invention is applied. The construction of the wireless mobile communication device has been described above, and therefore, the explanation is not repeated.

Figure 2:
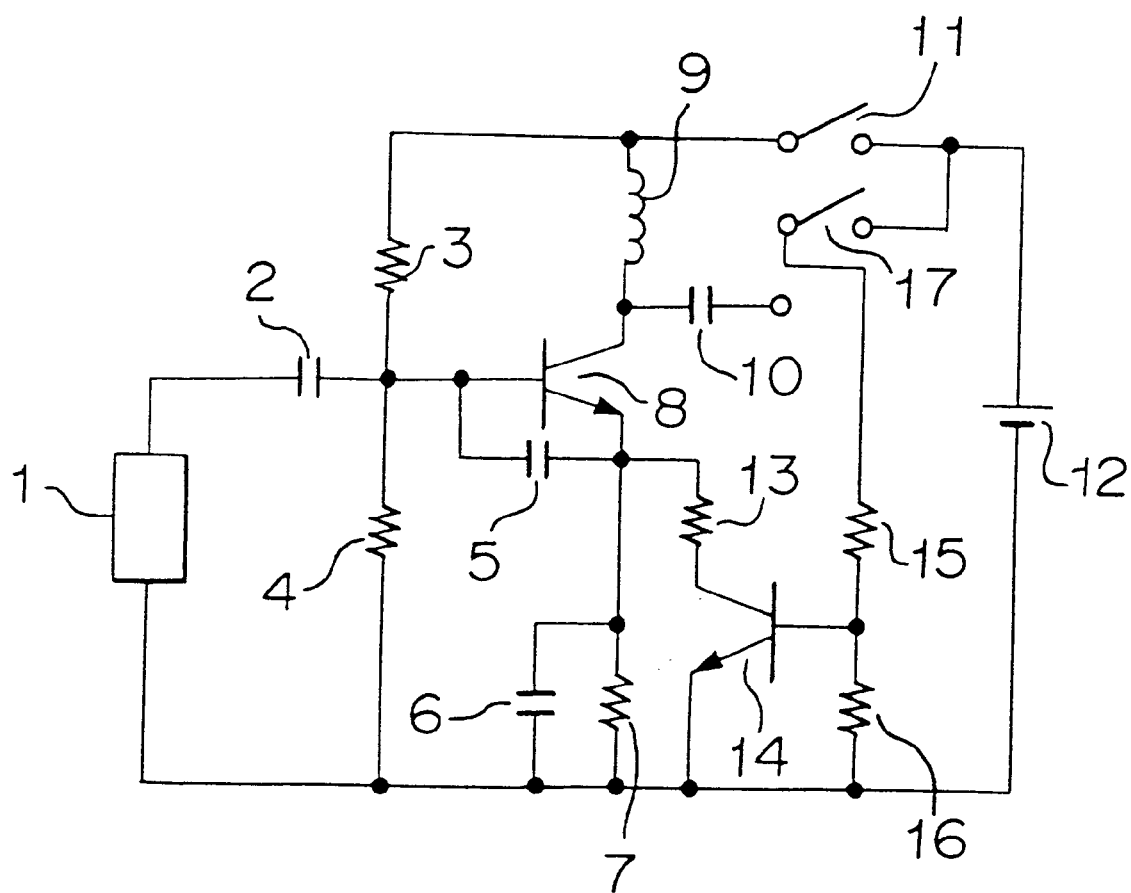
FIG. 2 is a circuit diagram of an oscillator according to a first embodiment of the present invention.
Figure 12:
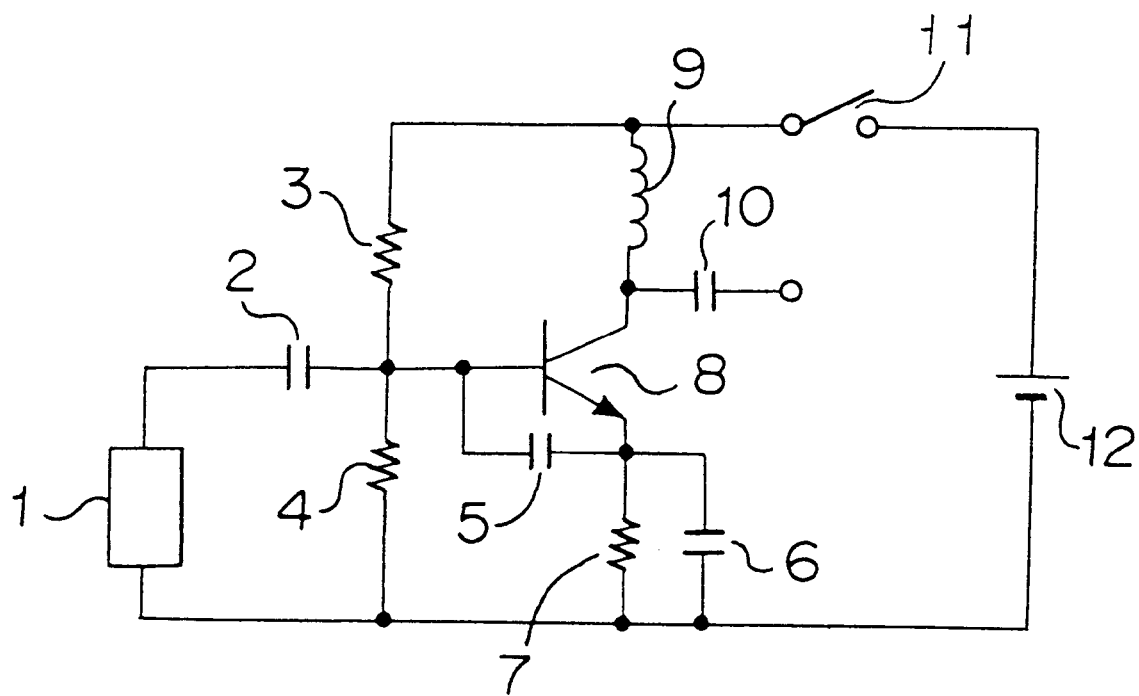
FIG. 12 is a circuit diagram of a conventional oscillator.

FIG. 2 is a circuit diagram of a first embodiment of the crystal oscillator of the present invention. In FIG. 2, the same reference numerals as described in FIG. 12 designate the same or corresponding parts. Namely, numeral 1 designates a crystal vibrator, numeral 2 designates a coupling capacitor connected in series to the crystal vibrator 1, numerals 3 and 4 designate resistors for producing a bias voltage, numeral 5 designates a base-emitter capacitor, numeral 6 designates an emitter-GND capacitor, numeral 7 designates an emitter resistor, numeral 8 designates a transistor, numeral 9 designates an inductor as a load at a connector side, numeral 10 designates a connecting capacitor, numeral 11 designates a switch for connecting power source and numeral 12 designates a power source.

A resistor 13 for determining the second operating current for the transistor 8 is connected to an emitter side of the transistor 8. A controlling transistor 14 is provided to connect the resistor 13 connected at a collector side to the ground (GND). Numerals 15 and 16 designate bias resistors for the controlling transistor 14, and numeral 17 designates a second switch (SW) which turns on the transistor 14. A resistance value of the emitter resistor 7 is so determined as not to oscillate the vibrator immediately when the switch 11 for connecting power source is in an ON state and the second switch 17 is in an OFF state. A resistance value of the resistor 13 is so determined as to start oscillation in the oscillator when the second switch 17 becomes an ON state and the transistor 14 is turned on.

In FIG. 2, the transistor 8 corresponds to an amplifying element; the resistors 3, 4 and 7, capacitors 5, 6 and 10 and the inductor 9 correspond to a feedback element; the crystal vibrator 1 corresponds to a resonator, and switches 11 and 17, resistors 13, 15 and 16 and the transistor 14 corresponds to a power source control means.

Operations of the crystal oscillator of the first embodiment of the present invention will be described with reference to FIGS. 2 and 3.

As described above, since it is necessary to establish a relation of R<|Rn|, where R is a loss in the crystal vibrator, in order to oscillate the conventional oscillator, a value Gm should be large. Further, an impedance $1/\omega C6$ of the capacitor 6 should be sufficiently smaller than an emitter resistance Re. Accordingly, there is a limitation in increasing a value of $1/\omega2C5C6$ exceedingly, and on the other hand, when the value is too small, a substantial time is required for charging and discharging.

The circuit according to the first embodiment of the invention is provided with a serial connection of the resistor 13 and the collector and the emitter of the transistor 14, the serial connection being connected between the emitter of the transistor 8 and GND, and the resistors 15, 16 and the second switch 17 which are collected to the base of the transistor 14, in addition to the first switch 11 which applies a voltage to the entire circuit as shown in FIG. 2.

The operation of the oscillator of the first embodiment will be described in more detail with reference to FIG. 3 showing a timing chart of intermittently receiving signals in the TDMA system.

FIG. 3a shows the structure of a reception frame in which a reception period and a pause period repeatedly appear. Each reception period comprises frames F1, F2 ... F20 each having 2.5 ms.

FIG. 3b shows the structure of slots in each of the frames wherein a frame is divided into a transmission slot and a reception slot. The transmission slot comprises four slots T1, T2, T3 and T4, and the reception slot comprises four slots R1, R2, R3 and R4.

FIG. 3c shows a timing of receiving signals in a mobile communication terminal to which the reception slot R3 is assigned.

FIG. 3d shows the timing for controlling the switch 11 in the oscillation circuit shown in FIG. 2.

FIG. 3e shows a timing for controlling the switch 17 in the oscillation circuit shown in FIG. 2.

As shown in FIG. 3d, the switch 11 is closed at a time point t1. At this moment, the switch 17 is in an OFF state as shown in FIG. 3e. In the oscillator, accordingly, charging/discharging is effected to the transistor 8, the capacitors 5, 6 and the crystal vibrator by applying a small amount of emitter current Ie=(Eb−Vbe)/Re which is determined by the value of the resistor 7. As a result, charging/discharging to each of the elements becomes steady although there occurs no oscillation.

As shown in FIG. 3e, the switch 17 is brought into an ON state at a time point t2 just before the reception of the reception slot R3. When the switch 17 is ON, the transistor 14 is also turned on through the resistors 15, 16, and an emitter current Ie (which is described in the following formula) capable of causing oscillation is supplied to the transistor 8 to thereby start the oscillation:

$$Ie=(Eb-Vbe)/Re+(Eb-Vbe-Vce(\text{sat})\ 14)/R13$$

where Vce(sat)14 represents a saturated voltage of the transistor 14 and R13 represents a resistance value of the resistor 13.

At this moment, since the crystal vibrator and each of the capacitors have already been charged, they produce a conversion conductance Gm which is determined by a operating current just after the time point t2, whereby the oscillation is quickly started and then, the oscillation becomes stable. As described above, the circuit shown in FIG. 2 can shorten a time for charging each of the elements whereby a time from the rising of the power source to a stable oscillation can be shortened. Also, this configuration it can save the average current.

Thus, in accordance with the oscillator described in the first embodiment of the invention, it includes a negative impedance circuit having an amplifying element and a feedback element: a resonator connected to the negative impedance circuit; a power source connected to the negative impedance circuit and a power source control means connected to the power source wherein the power source control means is so adapted that before initiating oscillation, the elements in the negative impedance circuit and the resonator are charged with an electric current of a value which does not cause the oscillation of the oscillator, and at the time of initiating the oscillation, a sufficient amount of electric current is supplied to the amplifying element of the negative impedance circuit to thereby cause the oscillation of the oscillator without changing a voltage applied to each of the elements and the resonator. Accordingly, the oscillation can be started in a short time to thereby prevent increase in an average electric current flowing in the oscillator. In particular, since an applied voltage is not changed, there is effected no charging/discharging in the elements, and the oscillation can quickly be started.

In particular, a communication device according to the present invention has a communication means for effecting time-division multiplex accessing for plurality of time slots and an oscillator for supplying a signal of predetermined frequency to the communication means wherein the oscillator includes a negative impedance circuit including an amplifying element and a feedback element; a resonator connected to the negative impedance circuit; a power source connected to the negative impedance circuit, and a power source control means connected to the power source, wherein the power source control circuit means is adapted so that before initiating oscillation, the elements in the negative impedance circuit are charged with an electric current of a value which does not cause the oscillation of the oscillator, and at the time of initiating the oscillation, a sufficient amount of electric current is supplied to the amplifying element of the negative impedance circuit to thereby cause the oscillation of the oscillator without changing a voltage supplied to each of the elements. Accordingly, the oscillation can quickly be started in a short time when time slots in time-division multiplex communication are to be received, whereby an increase in an average electric current can be avoided; a battery to be used can be of a small size, and the size and the weight of the communication device can be reduced. In particular, since an applied voltage is not changed, there is no charging/discharging to the elements and the oscillation can quickly be started.

As described above, the first embodiment of the invention has such a structure that the crystal vibrator 1 and the elements in the negative impedance circuit are charged in a preparatory period. However, it is possible to form the oscillator so that only the elements in the negative impedance circuit are charged.

Figure 4:
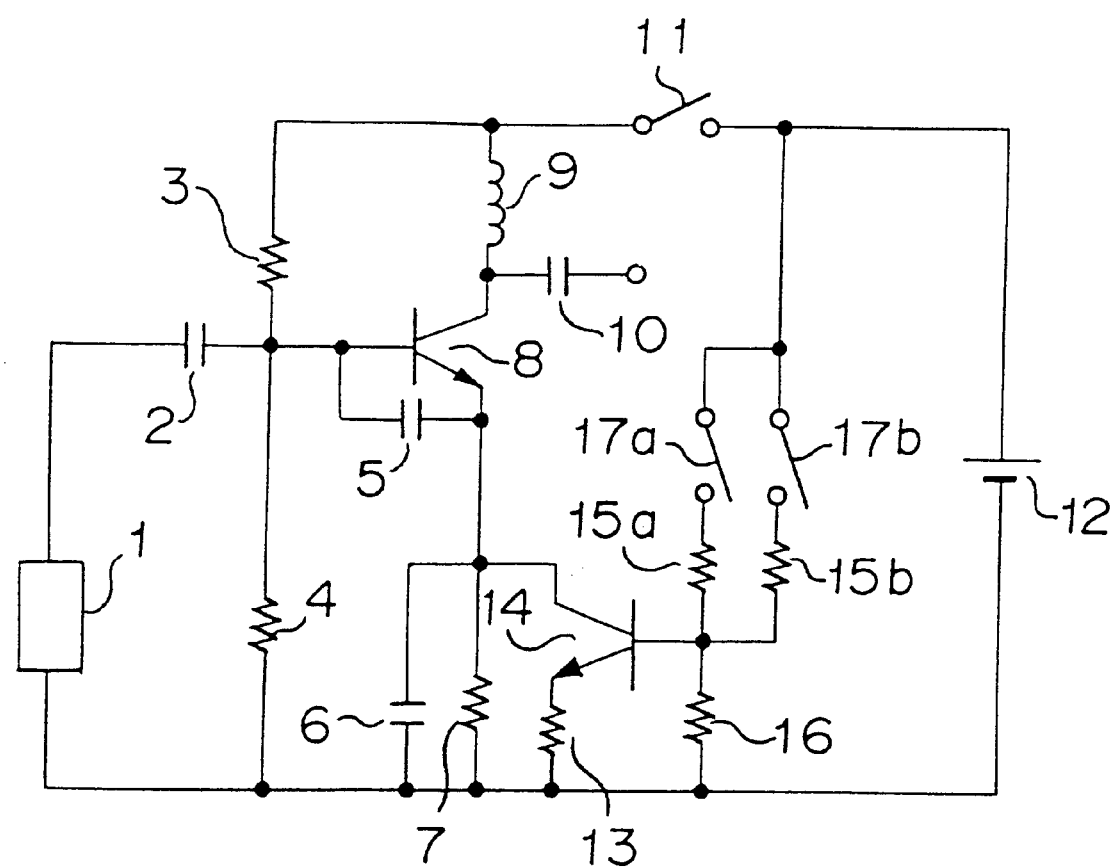
FIG. 4 is circuit diagram of an oscillator according to the second embodiment of the present invention.

FIG. 4 is a circuit diagram of the oscillator formed in accordance with a second embodiment of the present invention.

In FIG. 4, the same reference numerals as in FIG. 2 designate the same or corresponding parts, and description of these parts is omitted. Numeral 13 designates a resistor which determines a current value to a constant current source transistor 14, numerals 15a, 15b and 16 designate resistors which determine a bias voltage for the transistor 14 and determine a current value of the constant current source, and numerals 17a, 17b designate switches for switching the current value of the constant current source. The switch 17b and the resistor 15b act as a current limiting means for limiting a current to maintain the oscillation of the oscillator.

The resistance value of each of the resistors 7, 14, 15a, 15b and 16 is so determined as to provide a current value not which does cause the oscillation of the oscillator when the switch 11 is closed; to provide an electric current having a higher value than the minimum current value for starting the oscillation of the oscillator when all the switches 11, 17a and 17b are closed, and to provide a current value sufficient to maintain the oscillation of the oscillator when the switches 11 and 17b are closed.

The operations of the oscillator according to the second embodiment will be described with reference to FIG. 5 showing a timing of controlling signals. FIG. 5a shows reception slot R3 to be received; FIG. 5b shows how to control the switch 11; FIG. 5c shows how to control the switch 17a; and FIG. 5d shows how to control the switch 17b.

As shown in FIG. 5b, the switch 11 is closed at a time point t1. At this moment, the switches 17a, 17b are in an OFF state as shown in FIGS. 5c and 5d. Accordingly, charging/discharging to the transistor 8, the capacitors 5, 6 and the crystal vibrator in the oscillator is effected by feeding a small amount of an emitter current Ie=(Eb−Vbe)/ Re which is determined by a resistance value of the resistor 7. As a result, the charging/discharging to each of the elements of the oscillator reaches a steady state although the oscillation of the oscillator is not initiated.

As shown in FIG. 5c, the switches 17a and 17b become an ON state at a time point t2 just before the reception of the reception slot. When the switches 17a, 17b become an ON state, the transistor 14 is turned on through the resistors 15, 16. As a result, an emitter current Ie represented by the following formula passed in the transistor 8 to initiate the oscillation:

$$Ie=(Eb-Vbe)/Re+(Eb-Vbe-Vce(\text{sat})\ 14)/R13$$

where Vce(sat)14 represents a saturated voltage to the transistor 14 and R13 represents a resistance value of the resistor 13. The emitter current Ie has a current value higher than the lowest current value which is necessary to initiate the oscillation of the oscillator.

At this moment, since the crystal vibrator and each of the capacitors are already charged, they provide a conversion conductance Gm determined by an operating current just after the time point t2, whereby the oscillation is quickly initiated and the oscillation becomes stable. Accordingly, a time from the rising of the power source to a stable oscillation can be shortened by a time for charging/discharging each of the elements, and an average current flowing in the oscillator can be reduced. In particular, it is possible to shorten a time to cause the oscillation by increasing a value of the emitter current Ie.

In order to reduce an average current to be consumed after the quick rising, the switch 17b is brought to an OFF state at a time point t3 just before the reception slot. When a bias voltage at this moment is expressed by Eb14(2), an electric current Ie as shown in the following formula is supplied:

$$Ie=(Eb-Vbe)/Re+(Eb14(2)-Vbe14)/Re13.$$

The emitter current Ie has a current value sufficient to maintain the oscillation.

Thus, since a period for initiating the oscillation can be shortened by increasing an electric current value of constant current source, an average electric current can be reduced. Further, the oscillator of the second embodiment can limit an electric current to have a higher current value than that required for the oscillation, and a limited amount of current is continuously supplied to the oscillator, whereby an unstable oscillation caused by an undesired oscillation can be prevented.

Thus, the oscillator of the second embodiment of the invention includes a negative impedance circuit having an amplifying element and a feedback element; a resonator connected to the negative impedance circuit; a power source connected to the negative impedance circuit, and a power source control means connected to the power source, wherein the power source control means is adapted so that before initiating oscillation, the elements in the negative impedance circuit and the resonator are charged with an electric current of a value which does not cause the oscillation of the oscillator, and at the time of the oscillation, a sufficient amount of electric current is supplied to the amplifying element of the negative impedance circuit and the resonator to thereby cause the oscillation of the oscillator without changing a voltage applied to each of the elements. Accordingly, the oscillation can be initiated in a short time, and therefore, an increase in an average current can be prevented. In particular, since an applied voltage is not changed, there is no charging/discharging to the elements, and a quick rise of oscillating operations is obtainable.

In the second embodiment of the invention, in particular, the power source control means of the oscillator has a current limiting means which initiates the oscillation of the oscillator by supplying a higher current than a current capable of initiating the oscillation of the oscillator, and which, after the initiation of the oscillation, limits the current to a value capable of maintaining the oscillation of the oscillator. Thus, it can supply a current having a higher value than the current for initiating the oscillation of the oscillator whereby operations of oscillation can quickly be started, and then, the current is limited to a current value capable of maintaining the oscillation of the oscillator thereby reducing the current consumed.

Further, the power source control means of the oscillator can change stepwisely the operating current for the amplifying element by using it as a current for a constant current source whereby the oscillation of the oscillator can be controlled in a flexible manner. Further, since an electric current value can be changed stepwisely by switching a plurality of resistors, the operations for oscillating the oscillator can be controlled with a simple structure in a flexible manner.

In the second embodiment of the invention, two switches 17a, 17b are used to limit a current value of the transistor 8. However, a three or more number of switches may be used. Alternatively, a variable resistor may be used.

Figure 6:
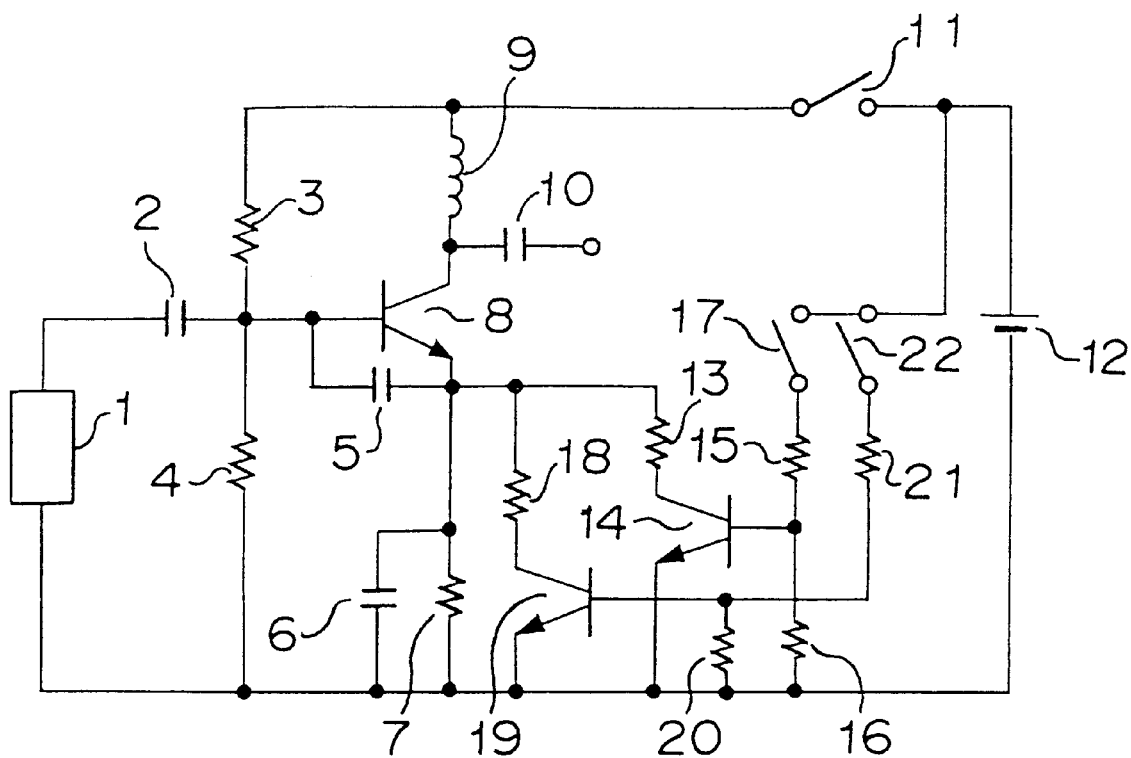
FIG. 6 a circuit diagram of an oscillator according to the third embodiment of the present invention.

FIG. 6 is a circuit diagram showing the oscillator according to the third embodiment of the present invention wherein the same reference numerals as in FIG. 2 designate the same or corresponding parts, and therefore, description of theses parts is omitted.

The oscillator of the third embodiment has, in addition to the first switch 11 for applying a voltage to the entire of the circuit, a serial connection of the resistor 13 and the collector and the emitter of the transistor 14 between the emitter of the transistor 8 and GND, and the resistors 15, 16 and the second switch 17 are connected to the base of the transistor 14. Further, there is provided a serial connection of a resistor 18 and the collector and the emitter of a transistor 19 between the emitter of the transistor 8 and GND, and resistance 20, 21 and a third switch 22 are connected to the base of the transistor 19. Resistance values of the resistors 13, 14 are respectively R13, R14.

FIG. 7 is a timing chart for explaining the operations of the oscillator of the third embodiment wherein FIG. 7a shows reception slot R3 to be received; FIG. 7b shows how to control the switch 11; FIG. 7c shows how to control the switch 17, and FIG. 7d shows how to control the switch 22.

As shown in FIG. 7b, the switch 11 is closed at a time point t1. At this moment, the switches 17, 22 are in an OFF state as shown in FIGS. 7c and 7d. Accordingly, charging/ discharging to the transistor 8, each of the capacitors 5, 6 and the crystal vibrator 1 is effected in the oscillator by feeding a small amount of an emitter current Ie=(Eb−Vbe)/Re which is determined by a resistance value of the resistor 7. As a result, charging/discharging to each of the elements become a steady state although the oscillation is not caused.

However, when the switches 17 and 22 are closed at a time point just before the reception of the reception slot as shown in the timing chart of FIGS. 7c and 7d, the transistor 14 is turned on through the resistors 15, 16, an emitter current represented as Ie13=(Eb−Vbe−Vce(sat)14)/R13 which accelerates the oscillation is supplied to the transistor 8, and at the same time, the transistor 19 is turned on through the resistors 20, 21. Then, an emitter current represented as Ie18=(Eb−Vbe−Vce(sat)14)/R18 which further accelerates the oscillation is supplied to the transistor 8, with the result of which a current represented as Ie=(Eb−Vbe)/Re+Ie13+Ie18 is supplied to the transistor 8 whereby the oscillation is quickly started.

At this moment, since the crystal vibrator and each of the capacitors are already charged, they quickly increase a conversion conductance Gm due to a quick increase of operating current by the emitter currents Ie13 and Ie18, whereby a quick rise of oscillation can be achieved. After the quick rise, the switch 22 is opened just before the reception slot in order to reduce an average electric current to be consumed, as shown in FIG. 7d. In this case, only an oscillation maintaining current Ie=(Eb−Vbe)/Re+Ie13 is supplied as an operating current to the transistor 8.

In the third embodiment, an oscillation initiating period can be shortened by increasing the second emitter current, and it is possible to reduce an average current as a whole.

Thus, the oscillator according to the third embodiment includes a negative impedance circuit having an amplifying element and a feedback element, a resonator connected to the negative impedance circuit; a power source connected to the negative impedance circuit, and a power source control means, wherein the power source control means is so adapted that before initiating the oscillation, the elements in the negative impedance circuit and the resonator are charged with an electric current of a value which does not cause the oscillation of the oscillator, and at the time of initiating the oscillation, a sufficient amount of electric current is supplied to the amplifying element of the negative impedance circuit to thereby cause the oscillation of the oscillator without changing a voltage applied to each of the elements and the resonator. Accordingly, operations for the oscillation can be started in a short time, and an increase in an average current can be prevented. In particular, since an applied voltage is not changed, charging/discharging to the elements is not effected whereby the operation for the oscillation can be started quickly.

In the third embodiment, in particular, the power source control means of the oscillator includes a current limiting means which initiates the oscillation of the oscillator by supplying an electric current having a higher current value than a current capable of initiating of the oscillation of the oscillator, and which, after the initiation of the oscillation, limits the current to a value capable of maintaining the oscillation of the oscillator. Accordingly, operations for the oscillation can be started in a short time by supplying an electric current of a higher current value than a current for initiating the oscillation. Further, it can limit the current to a current level which maintains the oscillation of the oscillator whereby an amount of current to be consumed can be reduced.

Figure 8:
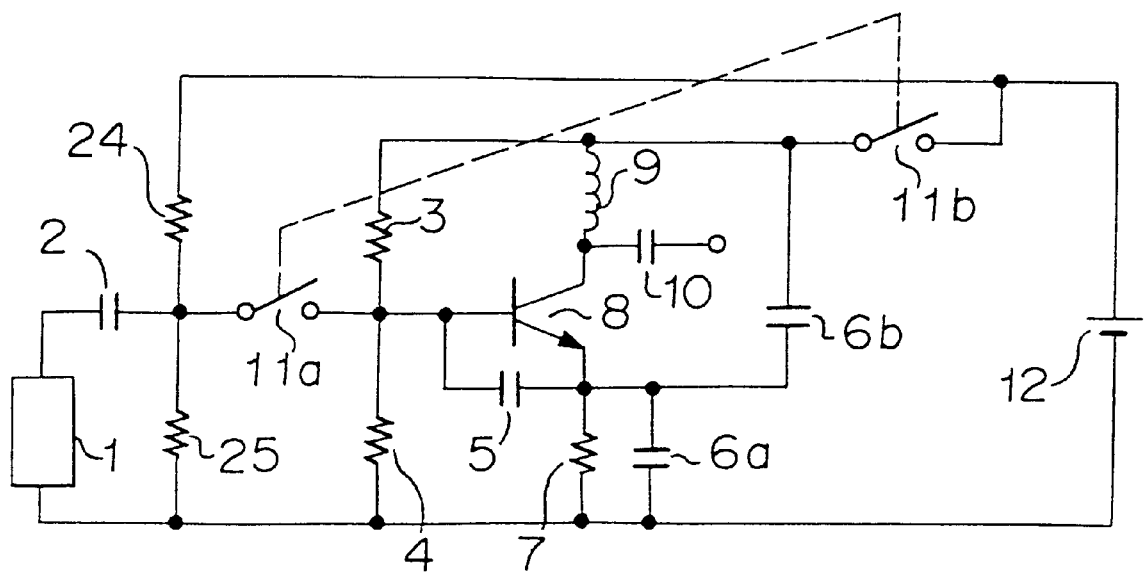
FIG. 8 is a circuit diagram of an oscillator according to the fourth embodiment of the present invention.

FIG. 8 is a circuit diagram showing the oscillator according to the fourth embodiment of the present invention wherein the same reference numerals as in FIG. 2 designate the same or corresponding parts, and therefore, description of these parts is omitted. The feature of the oscillator of the fourth embodiment is in that switches 11a and 11b are provided to operate in association with each other, and a bias voltage is previously applied to the crystal vibrator 1. Generally, a resonator such as the crystal vibrator is an element having the highest time constant.

In FIG. 8, the resistors 3, 4, the capacitors 5, 6a, 6b, 10, the negative inductor 9 and the transistor 8 constitute a negative impedance circuit. The switch 11a connects the negative impedance circuit to the crystal vibrator 1 to which a bias voltage is usually applied by means of the resistors 24, 25, for a limited period. In association with the operation of the switch 11a, the switch 11b connects the negative impedance circuit to the power source 12 in order to operate the circuit.

In operations, a voltage divided by the resistors 24, 25 is usually applied to the crystal vibrator 1. Before a timing to receive the reception slot, the switches 11a and 11b are brought to an ON state to connect to the negative impedance to the power source 12.

As shown in FIG. 8, since the crystal vibrator 1 is biased with a normally operable voltage, it is possible to start the oscillation just after the negative impedance circuit has been connected to the power source and the crystal vibrator 1. Since a voltage is applied to the crystal vibrator through the capacitor 2, an electric current is not consumed in the state other than a transient state. Accordingly, the resistors 24, 25 used can be of a higher resistance value, and an electric current consumed can be neglected. Therefore, an average electric current can be reduced for a time in which the oscillating operations can be shortened, in the same manner as the other embodiments.

As described above, the oscillator according to the fourth embodiment of the invention includes a negative impedance circuit having an amplifying element and a feedback element; a resonator connected to the negative impedance circuit; a power source connected to the negative impedance circuit, and a power source control means connected to the power source, wherein the power source control means is so adapted that before initiating oscillation, the resonator is charged with an electric current of a value which does not cause the oscillation of the oscillator, and at the time of initiating the oscillation, a sufficient amount of electric current is supplied to the amplifying element of the negative impedance circuit to thereby cause the oscillation of the oscillator without changing a voltage applied to the resonator. Accordingly, operations for the oscillation can be raised in a short time, and an increase in an average electric current can be prevented. In particular, since an applied voltage is not changed, charging/discharging to the elements is not effected, and the rising time of the oscillating operations becomes short.

Figure 9:
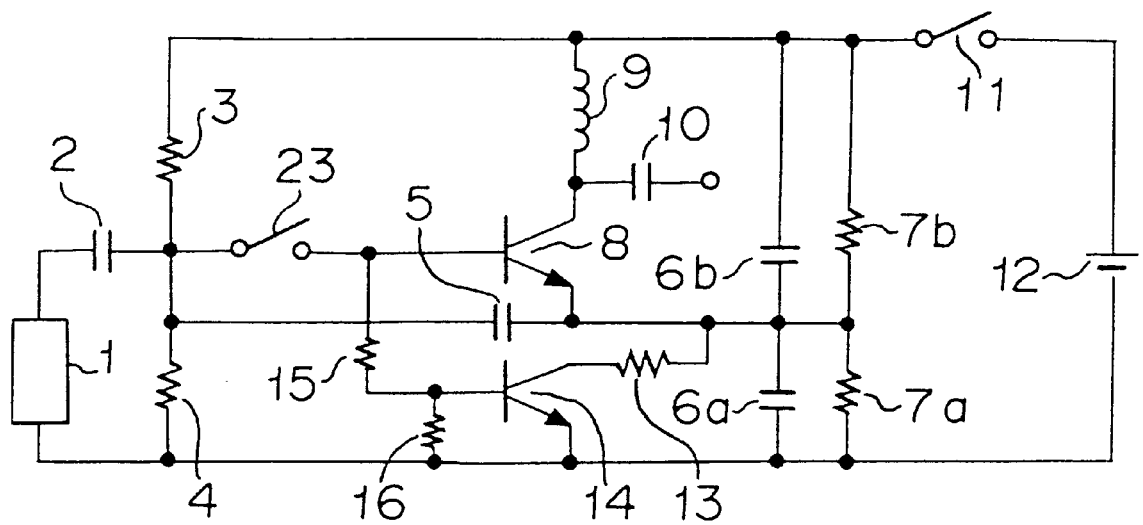
FIG. 9 is a circuit diagram of an oscillator according to the fifth embodiment of the present invention.

FIG. 9 is a circuit diagram showing the oscillator according to the fifth embodiment of the invention wherein the same reference numerals designate the same or corresponding parts, and description of these parts is omitted. The feature of this embodiment resides in that a switch 23 is connected between the crystal vibrator 1 which is biased with a voltage divided by the resistors 3, 4 at the time of oscillation and the base of the transistor 8, and that the feedback capacitors 5, 6 is applied with a bias voltage at the time of oscillation.

An electric current to be consumed when the switch 11 is closed is produced by the resistors 3, 4, 7a and 7b which are provided for producing a bias voltage, and therefore, a value of the electric current can be negligibly small. The capacitor 6b which quickly charge the capacitor 6a and which operates in parallel as a feedback capacitor for oscillation, has a capacitance of C6=C6a//C6b for operation. When the switch 23 is closed, the transistor 8 starts an amplifying operation. At the same time, it turns on the transistor 14 through the resistors 15, 16, and an operating current determined by the resistor 13 is supplied to the transistor 8 whereby the oscillation is initiated. At this moment, a predetermined voltage is already applied to each of the elements. Accordingly, charging/discharging is not effected, and a quick oscillation can be realized.

In the circuit of the oscillator according to the fifth embodiment, the crystal vibrator 1 and the feedback capacitors 5, 6a are biased with a voltage capable of oscillating in a closing state of the switch 11. Accordingly, as soon as the switch 23 is closed, the transistor 8 is connected to the crystal vibrator whereby the operating current of the transistor is increased to be ready for oscillation. The bias resistors 3, 4, 7a, 7b can be of a high resistance value, and therefore, a current to be consumed is negligible. In this embodiment, an average electric current can be reduced for a time in which operations for the oscillation are shortened, in the same manner as the other embodiments.

Thus, the oscillator of the fifth embodiment includes a negative impedance circuit having an amplifying element and a feedback element; a resonator connected to the negative impedance circuit; a power source connected to the negative impedance circuit, and a power source control means connected to the power source, wherein the power source control means is so adapted that before initiating oscillation, the resonator and the feedback element are charged with an electric current of a value which does not cause the oscillation of the oscillator, and at the time of initiating the oscillation, a sufficient amount of electric current is supplied to the amplifying element to thereby cause oscillation of the oscillator without changing a voltage applied to the resonator and the feedback element. Accordingly, operations for the oscillation can quickly be raised, and an increase in an average electric current can be prevented. In particular, since an applied voltage is not changed, charging/discharging to the elements is not effected, and the operations for the oscillation can quickly be started.

Figure 10:
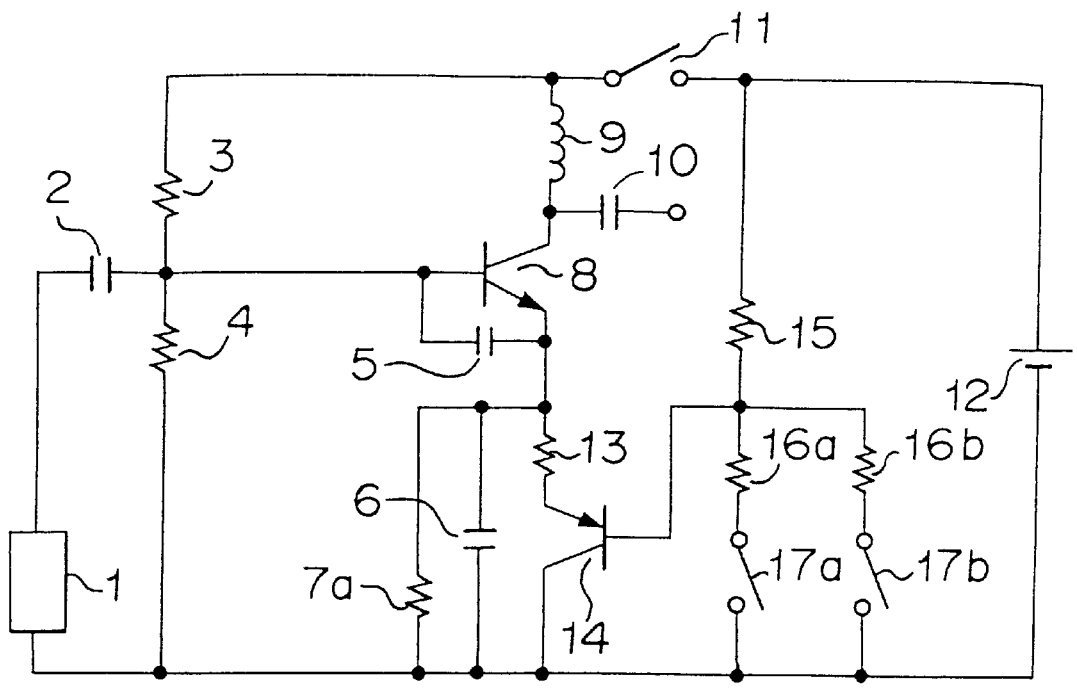
FIG. 10 is a circuit diagram of an oscillator according to the sixth embodiment of the present invention.

FIG. 10 is a circuit diagram showing the oscillator according to the sixth embodiment of the invention wherein the same reference numerals as in FIG. 2 designate the same or corresponding parts, and therefore, description of these parts is omitted.

In the sixth embodiment, in particular, a resistor 13 is connected between the emitter of the transistor 8 and the emitter of a PNP transistor 14, and resistors 15, 16a, 16b and switches 17a, 17b are provided in order that a base voltage of the transistor 14 is variable.

In a conventional circuit, when the switch 11 is closed, a base voltage does not immediately rise because of charging to the feedback capacitors 5, 6. Accordingly, an emitter current does not immediately increase; a mutual conductance Gm as an amplifying constant of the transistor does not also increase, and a negative conductance is small due to a small amplifying function so that the oscillation can not quickly be initiated.

In the circuit of the fifth embodiment as shown in FIG. 10, in addition to the first switch 11 for applying a voltage to the entire circuit, the resistor 13 is connected in series between the emitter of the transistor 8 and the emitter of the transistor 14, and the base of the transistor 14 is applied with a voltage Ea=Vcc(R16a//R16b)/[R15+(R16a//R16b)] which is divided by the resistors 15, 16a, 16b wherein the voltage is applied to the transistor 14 by means of the second and third switches 17a, 17b which are closed only in a limited period.

The operations of the sixth embodiment will be described with reference to FIG. 7 showing operations for intermittently receiving signals. First, the switch 11 is closed as shown in FIG. 3b. Since the switches 17a, 17b are in an OFF state, a small amount of an emitter current Ie=(Eb–Vbe)/Re which is determined by a resistance value of the resistor 7a flows in the transistor 8, each of the capacitors 5, 6 and the crystal vibrator to be charged and discharged. As a result, charging/discharging to each of the elements becomes a steady state although the oscillation is not started.

As described above, since the crystal vibrator 1 and the feedback capacitors 5, 6 are biased with a voltage ready for oscillation from the time of closing the switch 11, an operating current to the transistor 8 has a current value Ie described below upon closing the switches 17a, 17b, and the oscillation is immediately initiated by an increase of the current value:

$$Ie=(Eb-Vbe)/Re+(Eb-Vbe-Ea-Vbe14)/Re13$$

In the sixth embodiment in the same manner as the second embodiment, the switch 17b is opened after a predetermined period whereby a state shown in FIG. 5c is provided. When only the switch 11 is closed, an operating current determined by a resistance value of the resistor 7a is permitted to flow, and an amount of the current to be consumed can be neglected. In this embodiment, an average electric current can be reduced for a time in which operations for the oscillation is shortened, in the same manner as the other embodiments.

As described above, the oscillator according to the sixth embodiment includes a negative impedance circuit having an amplifying element and a feedback element; a resonator connected to the negative impedance circuit; a power source connected to the negative impedance circuit, and a power source control means connected to the power source, wherein the power source control means is so adapted that before initiating oscillation, the resonator and the feedback element are charged with an electric current of a value which does not cause the oscillation for the oscillator, and at the time of initiating the oscillation, a sufficient amount of electric current is supplied to the amplifying element to thereby cause the oscillation of the oscillator without changing a voltage applied to the resonator and the feedback element. Accordingly, operations for the oscillation can quickly be started, and an increase in an average electric current can be prevented. In particular, since an applied voltage is not changed, charging/discharging to the elements is not effected, and the operations for the oscillation can quickly be initiated.

In the sixth embodiment, in particular, the power source control means of the oscillator has a current limiting means which initiates the oscillation of the oscillator by supplying an electric current having a higher current value than a current capable of initiating the oscillation of the oscillator, and which, after the initiation of the oscillation, limits the current to a level capable of maintaining the oscillation of the oscillator. Accordingly, operations for the oscillation can be raised in a short time because an electric current having a higher current value than an electric current for initiating the oscillation of the oscillator is supplied. Further, it can reduce an amount of electric current to be consumed because a current value of the electric current is limited to a value capable of maintaining the oscillation of the oscillator after the initiation of the oscillation.

In addition, the power source control means of the vibrator is so adapted as to change a value of the electric current stepwisely by changing a terminal voltage of the resistors which determines an operating current to the amplifying element. Accordingly, the structure is simple and it is possible to control operations for the oscillation of the oscillator in a flexible manner.

Figure 11:
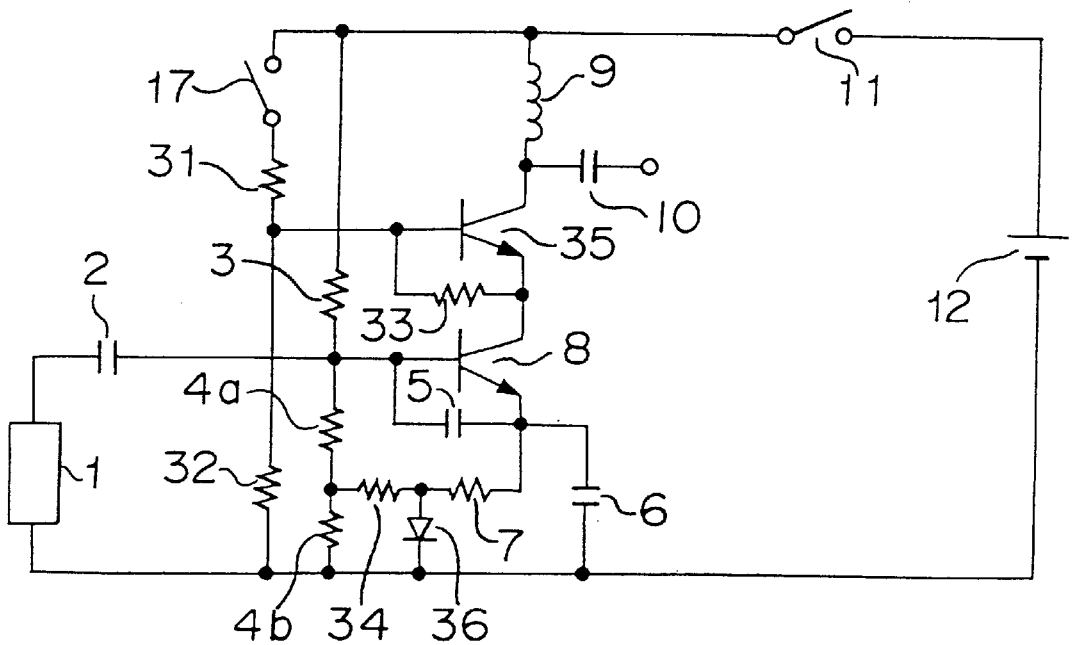
FIG. 11 is a circuit diagram of an oscillator according to the seventh embodiment of the present invention.

FIG. 11 is a circuit diagram showing the oscillator according to the seventh embodiment of the invention wherein the same reference numerals as in FIG. 2 designate the same or corresponding parts, and therefore, description of theses parts is omitted.

As shown in FIG. 11, a cascode type amplification circuit is formed by connecting the collector of the transistor 8 to the emitter of a transistor 35. The transistor 35 is an upper amplifier to which a base voltage is applied by means of resistors 31, 32, 33. The application of the base voltage is controlled by closing and opening a switch 17 which is connected in series to the resistor 31. The oscillator is constituted by the crystal vibrator 1, the bias resistors 3, 4a, 4b, 7, 34 and the feedback capacitors 5, 6, a diode 36 and the transistor 8 as a lower amplifier.

The base of the transistor 8 is connected with the crystal vibrator 1 and the capacitors 5, 6 as a feedback element. Accordingly, when the switch 11 is closed, the feedback capacitors 5, 6 are charged with a voltage divided by the bias resistors 3, 4a, 4b and a voltage produced at the diode 36, which is produced by applying a terminal voltage of the resistor 4b through the resistor 34. At the same time, a bias voltage is also applied to the transistor 8. In this case, however, an emitter current Ie=(Eb−Vbe)/(Re+Rd) does not flow in the transistor 8 since the transistor 35 is not activated due to the switch 17 being opened, and the transistor 8 can not initiate an amplifying operation, hence the oscillation can not be initiated. In the formula, Rd represents a differential resistance value of the diode 36.

Thus, the circuit of the oscillator of the seventh embodiment has the switch 17 in addition to the first switch for applying a voltage to the entire circuit as shown in FIG. 11. The switch 17 functions so that a voltage divided by the resistors 31, 32 is applied to the base of the transistor 35 only in a limited period. Before the operation of the switch 17, the switch 11 is first closed so that charging/discharging is conducted to the capacitors 5, 6 and the crystal vibrator 1. As a result, an operating current does not flow in the transistor 8, and charging/discharging to each of the elements becomes a steady state although the oscillation is not initiated.

When the switch 17 is subsequently closed, the transistor 35 is actuated to cause the oscillation of the oscillator.

In the oscillator of the seventh embodiment, the crystal vibrator 1 and the feedback capacitors 5, 6 are already biased with a voltage capable of causing the oscillation when the switch 11 is closed. Accordingly, when the transistor 34 is actuated upon the closing of the switch 17, an operating current to the transistor 8 is rapidly increased to thereby cause the oscillation. Before the switch 17 is closed, no electric current is passed in the transistor 8. Accordingly, an average electric current can be reduced for a time in which operations for the operation can be shortened, in the same manner as the other embodiments.

As described above, the oscillator according to the seventh embodiment includes a negative impedance circuit having a first amplifying element, a second amplifying element in a cascode connection to the first amplifying element and a feedback element; a resonator connected to the negative impedance circuit; a power source connected to the negative impedance circuit; and a power source control means connected to the power source, wherein the power source control means is so adapted that before initiating oscillation, the first amplifying element, the feedback element and the resonator are charged with an electric current of a value which does not cause the oscillation of the oscillator, and at the time of initiating the oscillation, a sufficient amount of electric current is supplied through the first amplifying element to the second amplifying element to thereby cause the oscillation of the oscillator.

Accordingly, operations for the oscillation can be initiated in a short time, and an increase in an average current can be prevented. In particular, since an applied voltage is not changed, charging/discharging to the elements is not effected, and operations for the oscillation can quickly be initiated.

Obviously, numerous modifications and variations of the present invention are possible in light of the above teachings. It is therefore to be understood that within the scope of the appended claims, the invention may be practiced otherwise than as specifically described herein.

What is claimed is:

1. An oscillator comprising:
   a negative impedance circuit including an amplifying element and a feedback element;
   a resonator connected to said negative impedance circuit;
   a power source connected to said negative impedance circuit; and
   a power source control means connected to said power source,
   wherein said power source control means operates, before initiating oscillation, to charge the elements in said negative impedance circuit with an electric current of a value which does not cause the oscillator to oscillate, and at the time of initiating the oscillation, to supply a sufficient amount of electric current to the amplifying element of said negative impedance circuit to cause the oscillator to oscillate without changing a voltage applied to each of the elements of said negative impedance circuit.

2. An oscillator according to claim 1, wherein said power source control means includes a current limiting means which initiates the oscillation of the oscillator by supplying an electric current having a higher current value than a current capable of initiating the oscillation of the oscillator, and which, after oscillation is initiated, limits the current to a value capable of maintaining the oscillation of the oscillator.

3. An oscillator according to claim 1, wherein said power source control means controls the oscillation by changing an operating current to the amplifying element.

4. An oscillator according to claim 3, wherein said power source control means changes stepwisely the operating current by using it as a current for a constant current source.

5. An oscillator according to claim 4, wherein said power source control means changes stepwisely the operating current by switching a plurality of switches.

6. An oscillator according to claim 4, wherein said power source control means changes stepwisely the operating current by changing a terminal voltage at resistances which determine the operating current to the amplifying element.

7. An oscillator comprising:
   a negative impedance circuit including an amplifying element and a feedback element;
   a resonator connected to said negative impedance circuit;
   a power source connected to said negative impedance circuit; and a power source control means connected to said power source, wherein said power source control means operates, before initiating oscillation, to charge said resonator with an electric current of a value which does not cause the oscillator to oscillate, and at the time of initiating the oscillation, to supply a sufficient amount of electric current to the amplifying element of said negative impedance circuit to cause the oscillator to oscillate without changing a voltage applied to said resonator.

8. An oscillator according to claim 7, wherein said power source control means includes a current limiting means which initiates the oscillation of the oscillator by supplying an electric current having a higher current value than a current capable of initiating the oscillation of the oscillator, and which, after oscillation is initiated, limits the current to a value capable of maintaining the oscillation of the oscillator.

9. An oscillator according to claim 7, wherein the power source control means controls the oscillation by changing an operating current to the amplifying element.

10. An oscillator comprising:

a negative impedance circuit including an amplifying element and a feedback element;

a resonator connected to said negative impedance circuit;

a power source connected to said negative impedance circuit; and a power source control means connected to said power source, wherein said power source control means operates, before initiating oscillation, to charge said resonator and the feedback element with an electric current of a value which does not cause the oscillator to oscillate, and at the time of initiating the oscillation, to supply a sufficient amount of electric current to the amplifying element to cause the oscillator to oscillate without changing a voltage applied to said resonator and the feedback element.

11. An oscillator according to claim 10, wherein said power source control means includes a current limiting means which initiates the oscillation of the oscillator by supplying an electric current having a higher current value than a current capable of initiating the oscillation of the oscillator, and which, after oscillation is initiated, limits the current to a value capable of maintaining the oscillation of the oscillator.

12. An oscillator according to claim 10, wherein said power source control means controls the oscillation by changing an operating current to the amplifying element.

13. An oscillator comprising:

a negative impedance circuit including a first amplifying element, a second amplifying element in a cascode connection to the first amplifying element and a feedback element;

a resonator connected to said negative impedance circuit;

a power source connected to said negative impedance circuit; and a power source control means connected to said power source, wherein said power source control means operates, before initiating oscillation, to charge the first amplifying element, said resonator and the feedback element with an electric current of a value which does not cause the oscillator to oscillate, and at the time of initiating the oscillation, to supply a sufficient amount of current through the first amplifying element to the second amplifying element to thereby cause the oscillator to oscillate. Without charging a voltage applied to the first amplifier, said resonator, and the feedback element.

14. An oscillator according to claim 13, wherein said power source control means includes a current limiting means which initiates the oscillation of the oscillator by supplying an electric current having a higher current value than a current capable of initiating the oscillation of the oscillator, and which, after oscillation is initiated, limits the current to a value capable of maintaining the oscillation of the oscillator.

15. An oscillator according to claim 13, wherein said power source control means controls the oscillation by changing an operating current to the amplifying elements.

16. A communication device comprising:

a communication means for effecting time division multiplex accessing for a plurality of time slots; and an oscillator for supplying a signal of predetermined frequency to the communication means, wherein said oscillator includes;

a negative impedance circuit including an amplifying element and a feedback element, a resonator connected to said negative impedance circuit, a power source connected to said negative impedance circuit, and a power source control means connected to said power source, wherein said power source control means operates, before initiating oscillation, to charge the elements in said negative impedance circuit with an electric current of a value which does not cause the oscillator to oscillate, and at the time of initiating the oscillation, to supply a sufficient amount of electric current to the amplifying element of said negative impedance circuit to cause the oscillator to oscillate without changing a voltage applied to each of the elements included in said negative circuit.

* * * * *